(12) United States Patent
Moon

(10) Patent No.: US 8,780,511 B2
(45) Date of Patent: Jul. 15, 2014

(54) ELECTROSTATIC DISCHARGE PROTECTION CIRCUIT

(75) Inventor: Jung-Eon Moon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 401 days.

(21) Appl. No.: 13/196,258

(22) Filed: Aug. 2, 2011

(65) Prior Publication Data

US 2012/0099230 A1 Apr. 26, 2012

(30) Foreign Application Priority Data

Oct. 25, 2010 (KR) .................. 10-2010-0103873

(51) Int. Cl.
*H02H 9/00* (2006.01)
(52) U.S. Cl.
USPC ............................................. 361/56

(58) Field of Classification Search
USPC ............................................. 361/56
See application file for complete search history.

(56) References Cited

U.S. PATENT DOCUMENTS 6,529,359 B1* 3/2003 Verhaege et al. ............. 361/100
7,280,332 B2* 10/2007 Ma et al. ...................... 361/91.1

* cited by examiner

*Primary Examiner* — Stephen W Jackson
(74) *Attorney, Agent, or Firm* — IP & T Group LLP

(57) ABSTRACT

An electrostatic discharge protection circuit includes a diode chain coupled between a power supply voltage end and a control node, a control voltage generator configured to generate a control voltage in response to a first current flowing through the diode chain, and a discharger configured to discharge a second current from the power supply voltage end to a ground voltage end in response to the control voltage, wherein the diode chain includes a plurality of P-well regions formed in an N-well region, diodes formed in the respective P-well regions, and a resistor coupled between the diodes.

9 Claims, 5 Drawing Sheets

ELECTROSTATIC DISCHARGE PROTECTION CIRCUIT

CROSS-REFERENCE TO RELATED APPLICATIONS

The present application claims priority of Korean Patent Application No. 10-2010-0103873, filed on Oct. 25, 2010, which is incorporated herein by reference in its entirety.

BACKGROUND

1. Field

Exemplary embodiments of the present invention relate to an electrostatic discharge protection circuit.

2. Description of the Related Art

Generally, electrostatic discharge (ESD) refers to a is phenomenon that current momentarily flows between two objects having different electrical potentials and insulated from each other due to a great voltage difference caused when they come into contact with each other.

Such an ESD current may apply a high level of voltage to a semiconductor device, thereby destroying the internal circuits of the semiconductor device. For this reason, semiconductor devices are generally equipped with an electrostatic discharge protection circuit between an input/output pad and an internal circuit to protect the internal circuit.

When a computer including a semiconductor integrated circuit is booted or a mounting test is performed, power noise may occur in a power supply voltage and as a result, high voltage and/or high current may be induced. The high voltage and/or high current induced from power noise enter the inside of a semiconductor integrated circuit through a power pin so as to damage the semiconductor integrated circuit.

The power noise generates the power noise pulse having tens to hundreds of rising times, compared to an electrostatic pulse, from which high voltage and/or high current are induced.

FIG. 1 is a schematic diagram illustrating a conventional electrostatic discharge protection circuit.

Referring to FIG. 1, the electrostatic discharge protection circuit includes a diode chain 110 coupled between a power supply voltage end 101 and a control node A, a control resistor 120 coupled between the control node A and a ground voltage end 102, and a discharge transistor 130 having a drain coupled with the power supply voltage end 101, having a source coupled with the ground voltage end 102, and receiving the voltage of the control node A as an input of a gate.

Hereafter, the operation of the electrostatic discharge protection circuit is described with reference to FIG. 1.

The voltage of the control node A is decided based on the voltage of the power supply voltage end 101. Within a power supply voltage VDD range that a semiconductor integrated circuit properly operates, a diode 111 does not conduct electric current and thus no current flows between the power supply voltage end 101 and the ground voltage end 102. Therefore, the voltage of the control node A equals to a ground voltage VSS. When the diode 111 become conductive (i.e., conduct electric current) in response to approximately 0.7V applied therebetween, the diode chain 110 of FIG. 1 does not conduct electric current until the power supply voltage VDD exceeds a voltage equal to approximately 2.8V since four diodes 111 are serially coupled. Therefore, the discharge transistor 130 is turned off, blocking current from flowing between the power supply voltage end 101 and the ground voltage end 102.

When the voltage of the power supply voltage end 101 is higher than a certain voltage, e.g., approximately 2.8V, due to electrostatic discharge or power noise, the diodes 111 becomes conductive and current flows through the diodes 111.

The current flowing through the diodes 111 flows into the control resistor 120. Thus, voltage drop occurs between both ends of the control resistor 120 and accordingly, the voltage of the control node A is raised. Since the voltage of the control node A is the voltage of a gate of the discharge transistor 130, when the voltages of the control node A increase to be higher than the ground voltage end 102 by a threshold voltage of the discharge transistor 130, the discharge transistor 130 is turned on.

When the discharge transistor 130 is turned on, current flows from the power supply voltage end 101 toward the ground voltage end 102 through the discharge transistor 130. If an excessive amount of charges accumulated in the power supply voltage end 101 is discharged to the ground voltage end 102 in conducting the current, the voltage of the power supply voltage end 101 is stabilized within the operation voltage range of the semiconductor integrated circuit. Through the process, the semiconductor integrated circuit is protected from electrostatic discharge or power noise.

FIG. 2 is a cross-sectional view illustrating the conventional electrostatic discharge protection circuit. Particularly, FIG. 2 shows a cross section of a diode chain 110.

As illustrated in FIG. 2, the diode chain 110 includes a plurality of N-well regions 202 that are formed in a P-type substrate 201, the diodes 111 formed in the N-well regions 202, and resistors 112 coupled between the diodes 111. Each of the diodes 111 is formed in a form of a PN junction by implanting a P-type impurity into a portion 205 of an upper portion of the N-well region 202.

Hereafter, a portion of a P-type substrate 201 where a P-type impurity is doped in a high concentration to facilitate the transfer of a voltage is referred to as a first region 203, and a portion of the N-well regions 202 where an N-type impurity is doped in a high concentration is referred to as a second region 204. A portion of the N-well regions 202 where a P-type impurity is doped in a high concentration to form a PN junction is referred to as a third region 205. A ground voltage VSS is applied to the first region 203 to electrically insulate adjacent diodes 111 from each other.

Here, a parasitic PNP bipolar transistor (PNP BJT) 206 having the third region 205 as an emitter, the N-well region 202 as a base, and the first region 203 as a collector may be formed. The parasitic PNP BJT 206 is turned on to operate with a conductive diode 111 when the voltage of the power supply voltage end 101 is raised. When the parasitic PNP BJT 206 is turned on, part of the current that flows toward the control resistor 120 is discharged to the third region 205 through the parasitic PNP BJT 206. The arrow mark 207 in the drawing signifies the path of leakage current. As a result, the intensity of the current 208 flowing toward the control resistor 120 becomes low and the voltage drop induced between both ends of the control resistor 120 becomes small. This decreases a control voltage and thus the discharge transistor 130 is not turned on so as not to protect the semiconductor integrated circuit. In short, even though electrostatic discharge or power noise occurs, the electrostatic discharge protection circuit may not operate due to the leakage current and the semiconductor integrated circuit may be damaged. In particular, the power noise causes a relatively small voltage change in the power supply voltage end 101 as compared with the electrostatic discharge, but it lasts much longer. Therefore, a conventional electrostatic discharge protection circuit may not effectively protect the integrated circuit from the power noise.

When the number of the diodes 111 is reduced to protect the integrated circuit form the power noise, the diodes 111 may become electrically conductive even at a typical operation voltage level of the semiconductor integrated circuit, and the electrostatic discharge protection circuit may malfunction.

SUMMARY

An embodiment of the present invention is directed to an electrostatic discharge protection circuit that may operate to protect an integrated circuit even at a slight change in a power supply voltage.

In accordance with an embodiment of the present invention, an electrostatic discharge protection circuit includes: a diode chain coupled between a power supply voltage end and a control node; a control voltage generator configured to generate a control voltage to the control node in response to a first current flowing through the diode chain; and a discharger configured to discharge a second current from the power supply voltage end to a ground voltage end in response to the control voltage, wherein the diode chain includes a plurality of P-well regions formed in an N-well region, diodes formed in the respective P-well regions, and a resistor coupled between the diodes.

DETAILED DESCRIPTION

Figure 1:
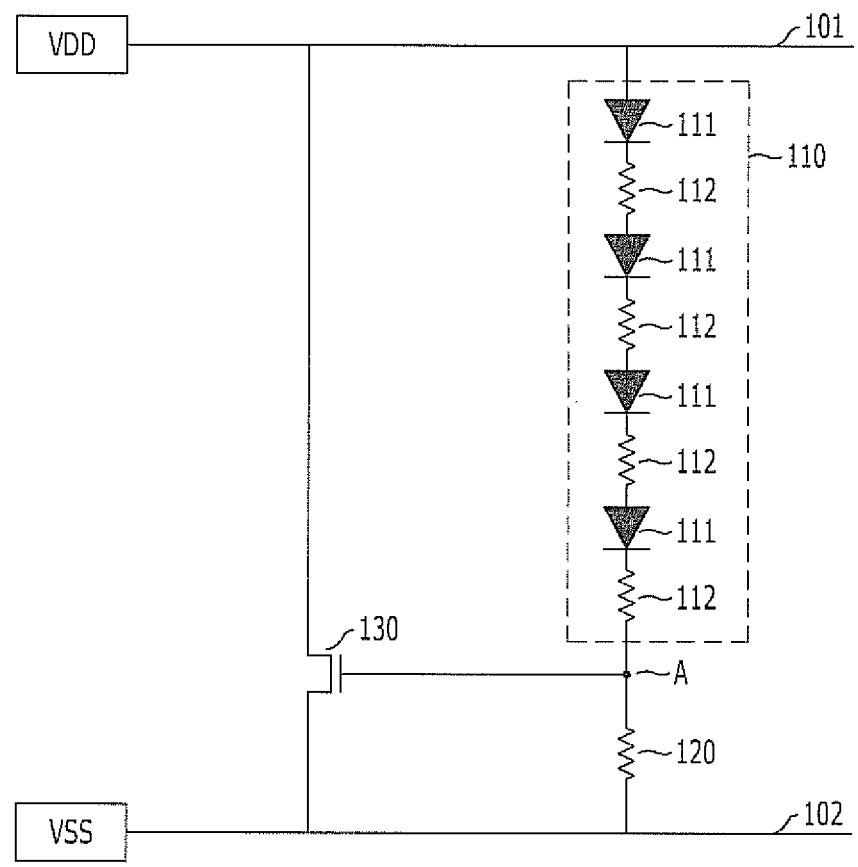
FIG. 1 is a schematic diagram illustrating a conventional electrostatic discharge protection circuit.
Figure 2:
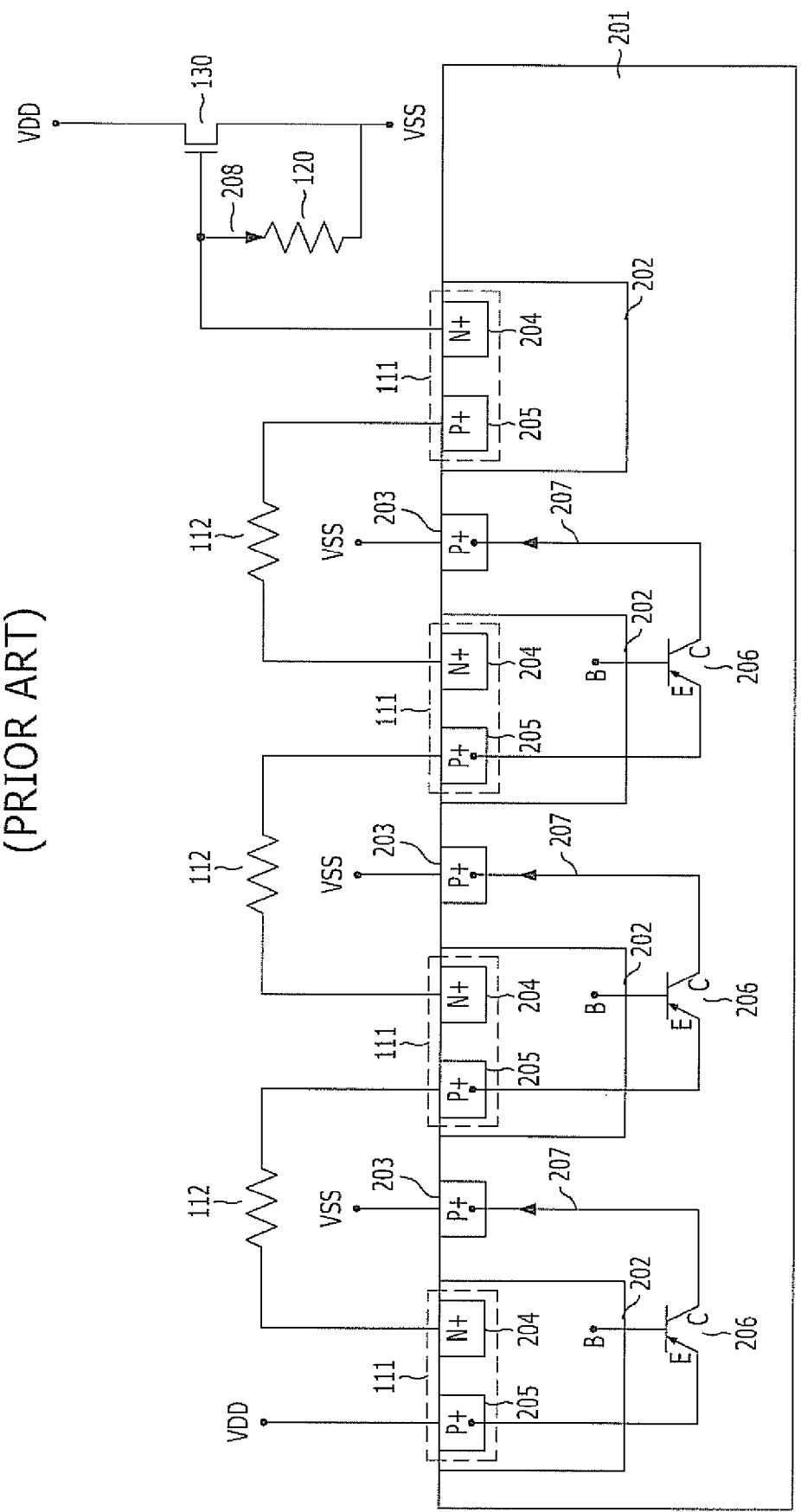
FIG. 2 is a cross-sectional view illustrating the conventional electrostatic discharge protection circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 3:
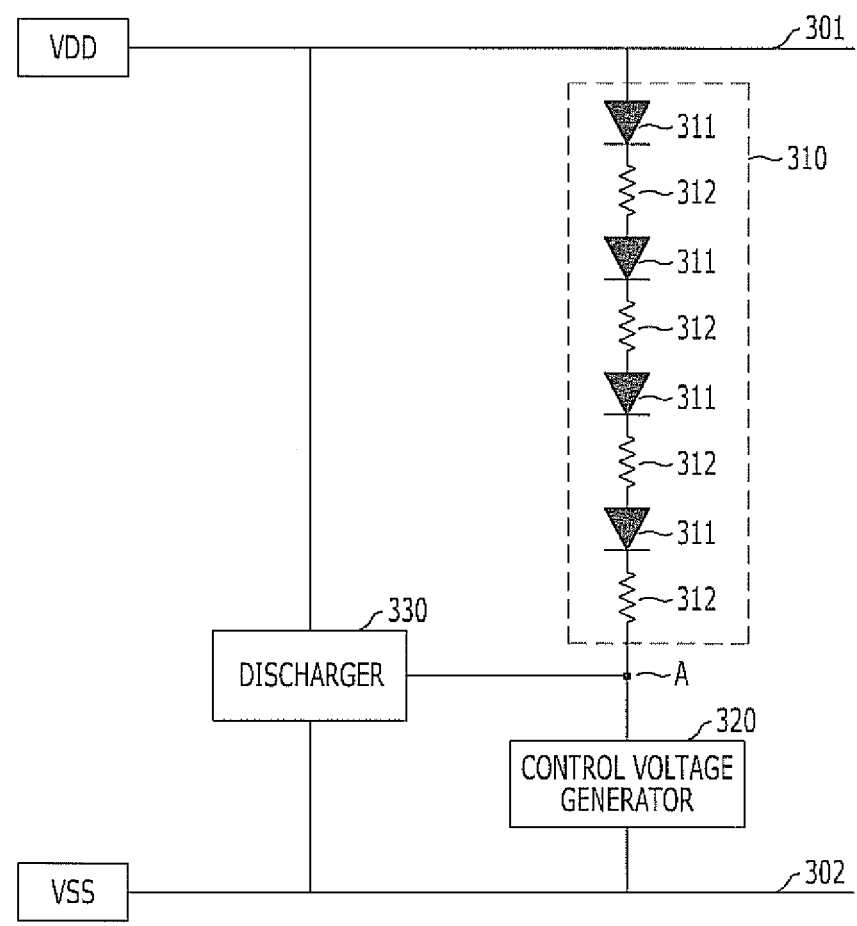
FIG. 3 is a schematic diagram illustrating an electrostatic discharge protection circuit in accordance with an embodiment of the present invention.

FIG. 3 is a schematic diagram illustrating an electrostatic discharge protection circuit in accordance with an embodiment of the present invention. Hereafter, the voltage of a power supply voltage end 301 signifies a power supply voltage VDD.

Referring to FIG. 3, the electrostatic discharge protection circuit according to the embodiment of the present invention includes a diode chain 310 coupled between a power supply voltage end 301 and a control node A, a control voltage generator 320 for generating a control voltage based on a current flowing through the diode chain 310, and a discharger 330 discharging a current from the power supply voltage end 301 to a ground voltage end 302 in response to the control voltage.

Referring to FIG. 3, the operation of the electrostatic discharge protection circuit is described.

The control voltage is determined based on the voltage of the power supply voltage end 301. When the power supply voltage VDD falls within the range of a general operation voltage of an integrated circuit, a plurality of diodes 311 are not electrically coupled and no current flows through the control voltage generator 320. Therefore, the control voltage, which is the voltage of the control node A, is the same as the ground voltage VSS. When the diodes 311 become conductive in response to a voltage equal to approximately 0.7V which is applied across the diodes 311, the diodes 311 are not electrically coupled until the power supply voltage VDD exceeds a voltage equal to approximately 2.8V in the case of FIG. 3 where four diodes 311 are serially coupled. The control voltage has a low ground voltage VSS, so that the discharger 330 is not enabled. Thus, current does not flow from the power supply voltage end 301 to the ground voltage end 302.

When the voltage of the power supply voltage end 301 is raised higher than a certain voltage, e.g., approximately 2.8V, due to electrostatic discharge or power noise, the diodes 311 are electrically coupled and current flows through the diodes 311.

The control voltage generator 320 generates a control voltage based on a voltage drop which occurs between both ends of the control voltage generator 320 as the current passing through the diode chain 310 flows through the control voltage generator 320. Here, the control voltage generator 320 may be a resistor coupled between the control node A and the ground voltage end 302. When current flows through a control resistor, which is the control voltage generator 320, potential level difference is caused between both ends of the control voltage generator 320 based on the Ohm's law and as a result, the voltage of the control node A is raised. The control voltage generator 320 may be not only a resistor but also a device at both ends of which voltage difference occurs by a current.

When the control voltage is increased to a predetermined level, the discharger 330 is enabled and current flows from the power supply voltage end 301 to the ground voltage end 302. Through the process, charges accumulated in the power supply voltage end 301 are discharged toward the ground voltage end 302, and through the discharge process, the voltage of the power supply voltage end 301 is stabilized into the operation voltage range of the integrated circuit. The discharger 330 may be a transistor having a drain coupled with the power supply voltage end 301, having a source coupled with the ground voltage end 302, and receiving the voltage of the control node A as an input of a gate. The discharger 330 may be a device that makes a current flow from the power supply voltage end 301 to the ground voltage end 302 in response to the control voltage, other than an NMOS transistor. For example, the discharger 330 may be a bipolar transistor (BJT).

Figure 4:
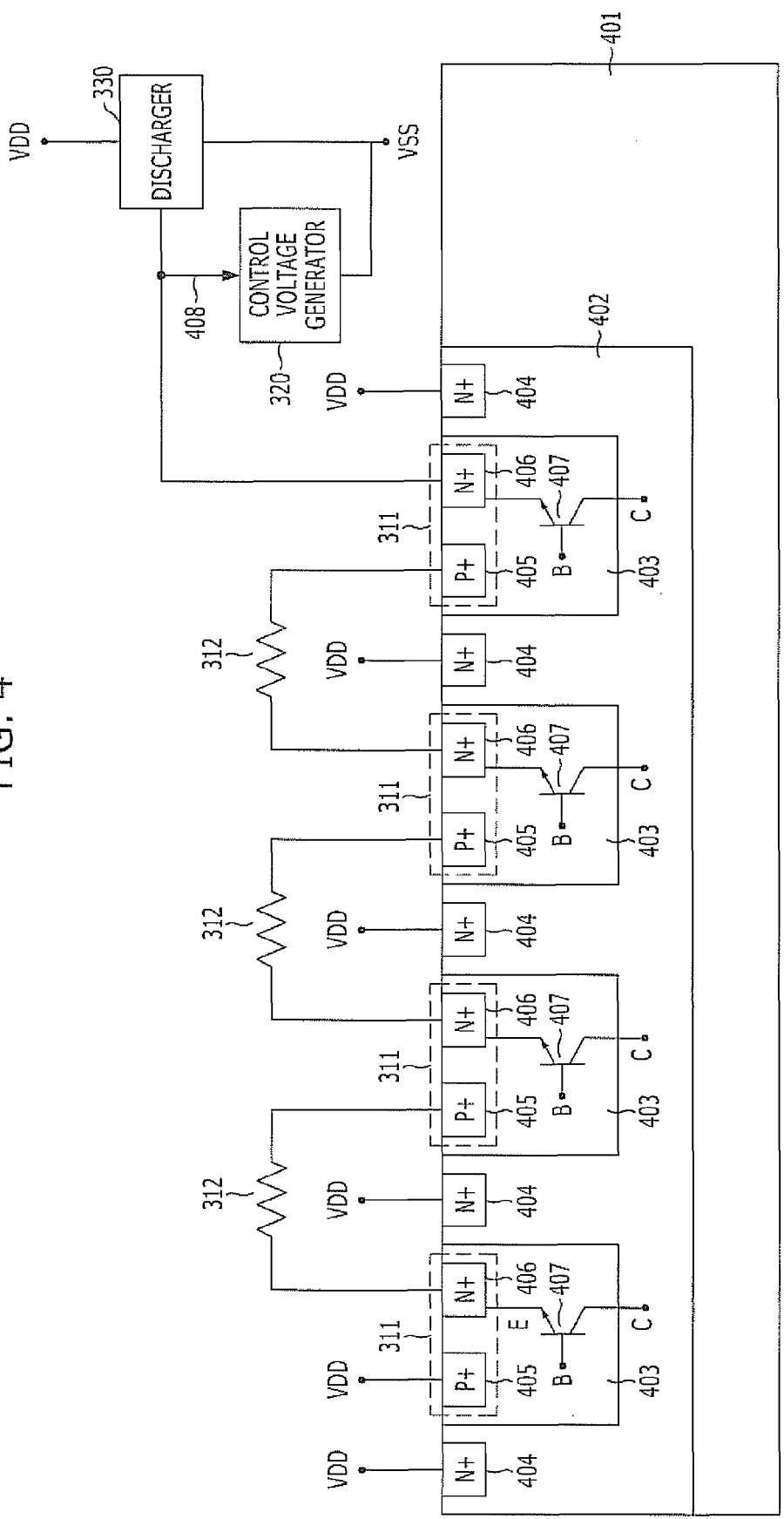
FIG. 4 is a cross-sectional view illustrating the conventional electrostatic discharge protection circuit in accordance with an embodiment of the present invention.

FIG. 4 is a cross-sectional view illustrating an electrostatic discharge protection circuit in accordance with an embodiment of the present invention.

Referring to FIG. 4, the diode chain 310 includes a plurality of P-well regions 403, diodes 311 formed in the respective P-well regions 403, and resistors 312 each coupled between the diodes 311. The diodes 311 are formed in the form of a PN junction by implanting an N-type impurity into a portion 405 of an upper portion of each P-well region 403. An N-well region 402 is formed over a P-type substrate 401.

Hereafter, a portion of the N-well region 402 where an N-type impurity is doped in a high concentration to facilitate the transfer of voltage is referred to as a first region 404, and a portion of the P-well region 403 where a P-type impurity is doped in a high concentration is referred to as a second region 405. Also, a portion of the P-well region 403 where an N-type impurity is doped in a high concentration for a PN junction is referred to as a third region 406. A power supply voltage VDD is applied to the first region 404 to electrically insulate adjacent diodes 311 from each other. 'P+' and 'N+' indicate the areas that are doped with a P-type impurity and an N-type impurity in high concentrations, respectively, compared with adjacent areas.

Here, a parasitic NPN bipolar transistor (NPN MT) 407 having the third region 406 as an emitter E, the P-well region 403 as a base B, and the N-well region 402 as a collector C may be formed. However, the parasitic NPN BJT 407 does not generate leakage current when the voltage of the power supply voltage end 301 is raised high and the electrostatic discharge protection circuit is operated. Rather, when the parasitic NPN BJT 407 is turned on, the amount of current 408 flowing through the control voltage generator 320 is increased. Therefore, the voltage drop occurring between both ends of the control voltage generator 320 is enlarged even at a slight increase of the voltage of the power supply voltage end 301 due to power noise or electrostatic discharge, compared with the voltage drop according to a conventional technology. In other words, although the voltage of the power supply voltage end 301 is increased a little bit, a greater control voltage than that of conventional technology is induced. A great current 408 flows through the control voltage generator 320 even at a slight change in the voltage of the power supply voltage end 301, and thus the electrostatic discharge protection circuit may sensitively react even at a slight change in the voltage of the power supply voltage end 301. In short, the sensitivity and current discharge capability of the electrostatic discharge protection circuit may be increased. The greater the control voltage is, the more current the discharger 330 may discharge.

Figure 5A:
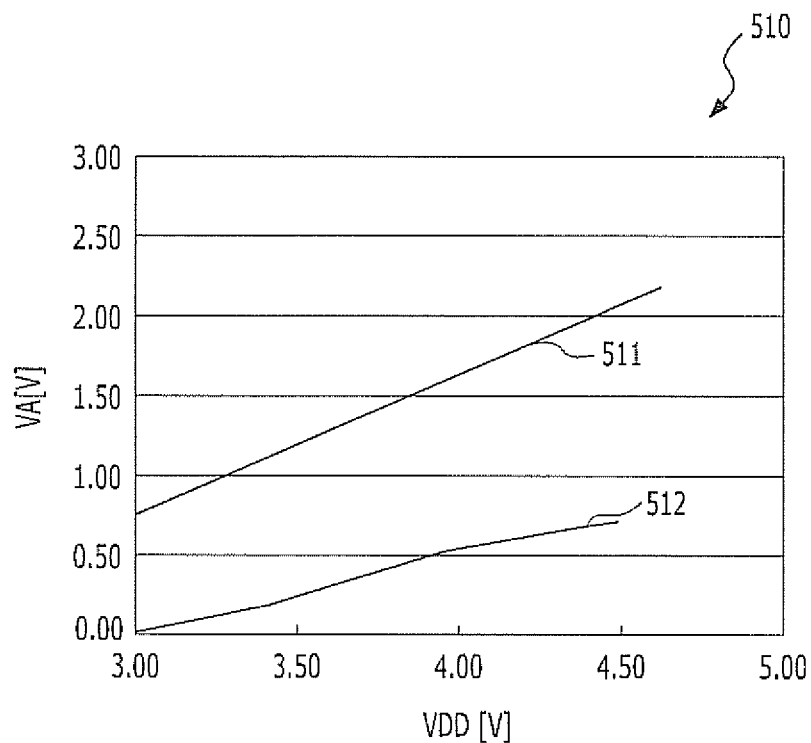
FIGS. 5A and 5B show operation characteristics of a conventional electrostatic discharge protection circuit and an electrostatic discharge protection circuit according to an embodiment of the present invention, respectively.
Figure 5B:
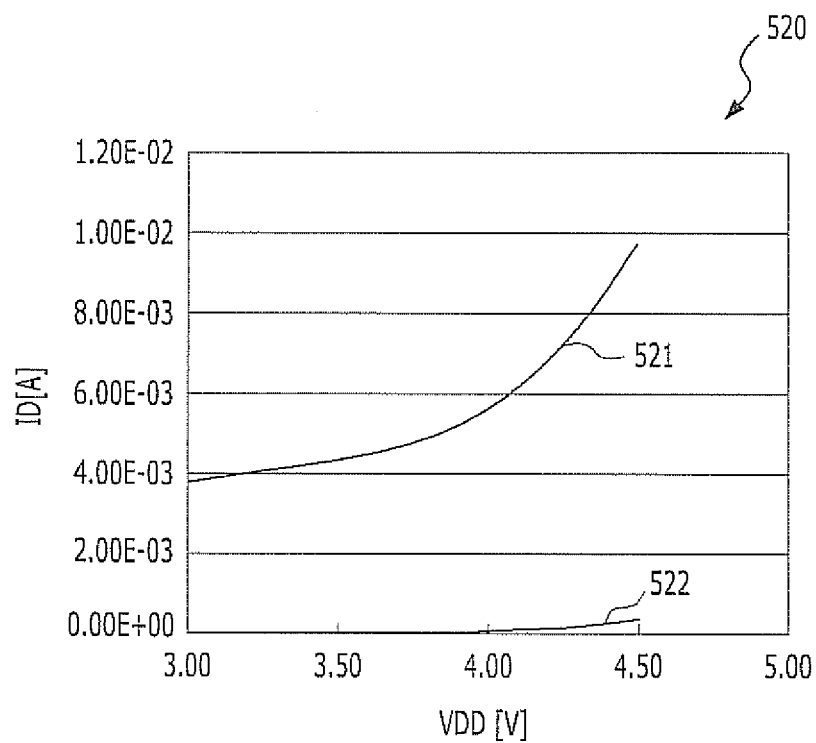

FIGS. 5A and 5B show operation characteristics of a conventional electrostatic discharge protection circuit and an electrostatic discharge protection circuit according to an embodiment of the present invention, respectively.

A first graph 510 shown in FIG. 5A illustrates the relationship between a power supply voltage VDD and a control voltage, which is the voltage VA of the control node A. The horizontal axis denotes the power supply voltage VDD, while the vertical axis denotes the control voltage VA. A first line 511 shows the relationship between a power supply voltage VDD and a control voltage VA in the electrostatic discharge protection circuit according to an embodiment of the present invention, and a second line 512 shows the relationship between a power supply voltage VDD and a control voltage VA in a conventional electrostatic discharge protection circuit. To compare the first line 511 with the second line 512, when the power supply voltage VDD is approximately over 3V, the control voltage VA of the electrostatic discharge protection circuit according to the embodiment of the present invention is greater than the control voltage VA of the conventional electrostatic discharge protection circuit. This signifies that the electrostatic discharge protection circuit according to the embodiment of the present invention operates sensitively even to a slight change in the voltage of the power supply voltage end 301.

A second graph 520 shown in FIG. 5B illustrates the relationship between a power supply voltage VDD and a current ID discharged by the discharger 330 from the power supply voltage end 301 to the ground voltage end 302. The horizontal axis denotes the power supply voltage VDD, while the vertical axis denotes the discharged current ID. In the second graph 520 shown in FIG. 5B, a first line 521 shows the relationship between a power supply voltage VDD and the discharged current ID in a electrostatic discharge protection circuit according to an embodiment of the present invention, and a second line 522 shows the relationship between the power supply voltage VDD and the discharged current ID in a conventional electrostatic discharge protection circuit. To compare the first line 521 with the second line 522, when the power supply voltage VDD is approximately over 3V, the discharging performance of the electrostatic discharge protection circuit according to the embodiment of the present invention is greatly higher than the conventional electrostatic discharge protection circuit.

Generally, the power supply voltage VDD ranges from approximately 1.2V to approximately 3.5V for the operation of an integrated circuit. Therefore, when the power supply voltage VDD exceeds a voltage equal to approximately 3.5V, the electrostatic discharge protection circuit is to properly operate. Referring to the second graph 520 of FIG. 5B, when the power supply voltage VDD exceeds a voltage equal to approximately 3.5V, the electrostatic discharge protection circuit according to the embodiment of the present invention has the great discharge protection performance This signifies that the electrostatic discharge protection circuit according to the embodiment of the present invention operates sensitively to a voltage change of the power supply voltage end 301.

According to an embodiment of the present invention, an electrostatic discharge protection circuit operates even at a slight change of a power supply voltage so as to protect an integrated circuit from being damaged.

While the present invention has been described with respect to the specific embodiments, it will be apparent to those skilled in the art that various changes and modifications may be made without departing from the spirit and scope of the invention as defined in the following claims.

What is claimed is:

1. An electrostatic discharge protection circuit, comprising:
a diode chain coupled between a power supply voltage end and a control node;
a control voltage generator configured to generate a control voltage to the control node in response to a first current flowing through the diode chain;
a discharger configured to discharge a second current from the power supply voltage end to a ground voltage end in response to the control voltage,
wherein the diode chain comprises a plurality of P-well regions formed in an N-well region, diodes formed in the respective P-well regions, and a resistor coupled between the diodes, wherein the diodes include a PN junction formed by implanting an N-type impurity into a first upper portion of the each P-well region; and a plurality of parasitic polar transistors each having an emitter in the first upper portion of the P-well region, a base in the P-well region, and a collector in the N-well region.

2. The electrostatic discharge protection circuit of claim 1, wherein the control voltage generator includes a resistor coupled between the control node and the ground voltage end.

3. The electrostatic discharge protection circuit of claim 1, wherein the control voltage generator is configured to generate the control voltage based on a voltage drop that occurs between both ends of the control voltage generator as the first current passes through the control voltage generator.

4. The electrostatic discharge protection circuit of claim 1, wherein the control voltage generator is configured to supply the control voltage to the control node.

5. The electrostatic discharge protection circuit of claim 1, wherein the discharger includes a transistor having a drain coupled with the power supply voltage end and a source coupled with the ground voltage end and receiving the control voltage as an input of a gate.

6. The electrostatic discharge protection circuit of claim 1, wherein the PN junction is formed by doping a P-type impurity in a higher concentration in a second upper portion of the each P-well region than other portions of the each P-well region.

7. The discharge protection circuit of claim 1, wherein the N-well region is formed over a P-type substrate.

8. The discharge protection circuit of claim 1, wherein the parasitic polar transistors increase a voltage drop between two ends of the control voltage generator.

9. The discharge protection circuit of claim 1, wherein an N-type impurity is doped at a higher concentration in an upper portion of the N-well region between the P-well regions than in other portions of the N-well region, wherein a power supply voltage is applied to the upper portion of the N-well region to electrically insulate the diodes.

* * * * *